(12) United States Patent
Hatton et al.

(10) Patent No.: US 8,216,491 B2
(45) Date of Patent: Jul. 10, 2012

(54) THIN FILM PRODUCTION

(75) Inventors: Ross Andrew Hatton, Guildford (GB);
Sembukutiarachilage Ravi Silva,
Camberley (GB)

(73) Assignee: University of Surrey (GB)

( * ) Notice: Subject to any disclaimer, the term of this patent is extended or adjusted under 35 U.S.C. 154(b) by 762 days.

(21) Appl. No.: 11/988,264

(22) PCT Filed: Jul. 7, 2006

(86) PCT No.: PCT/GB2006/002528
§ 371 (c)(1),
(2), (4) Date: Jan. 12, 2009

(87) PCT Pub. No.: WO2007/007061
PCT Pub. Date: Jan. 18, 2007

(65) Prior Publication Data
US 2009/0166591 A1 Jul. 2, 2009

(30) Foreign Application Priority Data
Jul. 7, 2005 (GB) .................................. 0514038.9

(51) Int. Cl.
*H01B 1/06* (2006.01)
*H01L 29/08* (2006.01)
*C09B 47/04* (2006.01)
*C07B 47/00* (2006.01)
(52) U.S. Cl. ........... 252/510; 257/40; 540/122; 540/145
(58) Field of Classification Search .................. 252/502, 252/510; 257/40; 540/122, 145; 136/263
See application file for complete search history.

(56) References Cited

U.S. PATENT DOCUMENTS

| | | | |
|---|---|---|---|
| 7,746,418 B2 * | 6/2010 | Wakita | 349/43 |
| 2003/0065206 A1 | 4/2003 | Bolskar et al. | 558/87 |
| 2003/0226996 A1 | 12/2003 | Aramaki et al. | 252/62.3 |
| 2006/0060839 A1 | 3/2006 | Chandross et al. | 257/40 |
| 2007/0151600 A1 * | 7/2007 | Li et al. | 136/263 |
| 2007/0152189 A1 * | 7/2007 | Li et al. | 252/299.01 |
| 2008/0277648 A1 * | 11/2008 | Wakita | 257/40 |
| 2010/0102299 A1 * | 4/2010 | Murase et al. | 257/40 |

FOREIGN PATENT DOCUMENTS

| | | |
|---|---|---|
| EP | 1 428 793 | 6/2004 |
| EP | 1 449 887 | 8/2004 |
| JP | 2005-162790 * | 6/2005 |

(Continued)

OTHER PUBLICATIONS

"Commission on Macromolecular Nomenclature, Glossary of Basic Terms in Polymer Science," Pure and Applied Chemistry, 68, pp. 2289, 2293 and 2298.

(Continued)

*Primary Examiner* — Mark Kopec
*Assistant Examiner* — Jaison Thomas
(74) *Attorney, Agent, or Firm* — Ballard Spahr LLP

(57) ABSTRACT

A method of producing a thin film comprising uniformly dispersed carbon nanotubes, the method comprising the steps of: adapting a molecular semiconductor to make it soluble; adapting the molecular semiconductor to facilitate the formation of a high degree of molecular order and frontier orbital overlap between adjacent molecules; adapting carbon nanotubes to make them soluble; combining the soluble carbon nanotubes and the soluble molecular semiconductor in a solvent to form a solution; producing the thin film from the solution.

23 Claims, 10 Drawing Sheets

FOREIGN PATENT DOCUMENTS

| | | |
|---|---|---|
| JP | 2005162790 | 6/2005 |
| WO | WO 03/011755 | 2/2003 |
| WO | WO 2005043639 A1 * | 5/2005 |

OTHER PUBLICATIONS

Bhattacharyya, et al., "Photovoltaic Properties of Dye Functionalized Single-Wall Carbon Nanotube/Conjuated Polymer Devices," Chemistry of Materials, 16, pp. 4819-4823, 2004.

Brabec, et al., "Production Aspects of Organic Photovoltaics and Their Impact on the Commercialization of Devices," MRS Bulletin, vol. 30, pp. 50-52, Jan. 2005.

Cao et al., "Photoconductivity Study of Modified Carbon Nanotube/ Oxotitanium Phthalocyanine Composites," Journal of Physical Chemistry B, vol. 106, No. 35, pp. 8971-8975, 2002.

Cao, Chen, et al., "Fabrication of Rare-Earth Biphthalocyanine Encapsulated by Carbon Nanotubes Using a Capillary Filling Method," Chemistry of Materials, vol. 15, No. 17, pp. 3247-3249, 2003.

Coakley, et al., "Ordered Organic-Inorganic Bulk Heterojunction Photovoltaic Cells," MRS Bulletin, vol. 30, pp. 37-40, Jan. 2005.

Dittmer, et al., "Crystal network formation in organic solar cells," Solar Energy Materials & Solar Cells, 61, pp. 53-61, 2000.

Forrest, S., "The Limits to Organic Photovoltaic Cell Efficiency," MRS Bulletin, vol. 30, pp. 28-32, Jan. 2005.

Gräetzel, M., Dye-Sensitized Solid-State Heterojunction Solar Cells, MRS Bulletin, vol. 30, pp. 23-27, Jan. 2005.

Gregg, B., "The Photoconversion Mechanism of Excitonic Solar Cells," MRS Bulletin, vol. 30, pp. 20-22, Jan. 2005.

Guldi, et al., "Donor-acceptor nanoensembles of soluble carbon nanotubes," Chem. Commun., pp. 2034-2035, 2004.

Janssen, et al., "Polymer-Fullerene Bulk Heterojunction Solar Cells," MRS Bulletin, vol. 30, pp. 33-36, Jan. 2005.

Kymakis and Amaratunga, "Photovoltaic cells based on dye-sensitisation of single-wall carbon nanotubes in a polymer matrix," Solar Energy Materials & Solar Cells, 80, pp. 465-472, 2003.

Kymakis and Amaratunga, "Single-wall carbon nanotube/conjugated polymer photovoltaic devices," Applied Physics Letters, vol. 80, No. 1, pp. 112-114, Jan. 7, 2002.

Li, et al., "Selective Interactions of Porphyrins with Semiconducting Single-Walled Carbon Nanotubes," Journal of the American Chemical Society, 126, pp. 1014-1015, 2004.

Milliron, et al., "Hybrid-Organic Nanocrystal Solar Cells," MRS Bulletin, vol. 30, pp. 41-44, Jan. 2005.

Murakami, et al., "Noncovalent porphyrin-functionalized single-walled carbon nanotubes in solution and the formation of porphyrin-nanotube nanocomposites," Chemical Physics Letters, 378, pp. 481-485, 2003.

Petritsch, et al., "Dye-based donor/acceptor solar cells," Solar Energy Materials & Solar Cells, 61, pp. 63-72, 2000.

Satake et al., "Porphyrin-Carbon Nanotube Composites Formed by Noncovalent Polymer Wrapping," Chemistry of Materials, 17, pp. 716-724, 2005.

Shaheen, et al., Organic-Based Photovoltaics: Toward Low Cost Power Generation, MRS Bulletin, vol. 30, pp. 10-15, Jan. 2005.

Wallace, et al., "Photoelectrochemical Cells Based on Inherently Conducting Polymers," MRS Bulletin, vol. 30, pp. 46-49, Jan. 2005.

Wang et al.; "Fabrication of carbon nanotubes/copper phthalocyanine composites with improved compatibility," Materials Science and Engineering B 117, pp. 296-301; 2005.

Wang, Liu, et al., "Immobilization of tetra-tert-butylphthalocyanines on carbon nanotubes: a first step towards the development of new nanomaterials," Journal of Materials Chemistry, 12, pp. 1636-1639, 2002.

Yang, et al., "Synthesis and photoconductivity study of carbon nanotube bonded by tetrasubstituted amino manganese phthalocyanine," Materials Science and Engineering, B 106, pp. 73-78, 2004.

International Preliminary Report on Patentability for PCT/GB2006/002528 date mailed Jun. 13, 2007.

International Search Report and Written Opinion for PCT/GB2006/002528 date mailed Dec. 18, 2006.

* cited by examiner

THIN FILM PRODUCTION

CROSS REFERENCE TO RELATED APPLICATIONS

The present application is a National Phase Application of International Application No. PCT/GB2006/002528, filed Jul. 7, 2006, which claims priority to Great Britain Patent Application No. 0514038.9, filed Jul. 7, 2005, which applications are incorporated herein fully by this reference.

The present invention relates to improvements in thin film production, for electronic devices employing organic semiconductors. In particular, the present invention relates to an improved method of producing a thin film of organic semiconductor with uniformly dispersed carbon nanotubes and devices incorporating such a thin film.

It should be noted that in this application carbon nanotube (CNT) is intended to mean single walled carbon nanotubes (SWCNT), multi-walled carbon nanotubes (MWCNT) or a mixture of both. Furthermore, since carbon nanotubes may be synthesised by several different methods (e.g. chemical vapour deposition (CVD), arc discharge and laser ablation methods) it should be noted that this application is not limited to any particular method of carbon nanotube production.

A great deal of research and development has been carried out in the area of carbon nanotube production. The applicant has previously filed patent applications associated with carbon nanotube production. One such application (PCT/GB02/003438 (WO03/011755)) relates to the production of carbon nanotubes at low temperatures enabling them to be deposited onto flexible plastics and at low cost.

Organic semiconductors can be processed into large area thin films at room temperature using spin coating or printing techniques. Progress in the development of electronic devices based on organic semiconductors has progressed rapidly in recent years, none more so than in the area of organic light-emitting diodes (OLEDs). Whilst OLEDs have entered the market place in niche applications, the potential of these devices has not been fulfilled, particularly in the field of large area displays.

Also, organic solar cells cannot even begin to realize their potential as an economically viable path to harvesting energy from the sun, without significant improvements in power conversion efficiency and device durability. Whilst conventional silicon solar cells exhibit high efficiencies and device durability, the fabrication costs are prohibitively high. In view of the urgent global need for clean, low cost energy solutions, solar cells are one of the most important potential applications of organic semiconductors.

A large amount of research and development has taken place into organic semiconductor materials and devices. Organic semiconductors can be broadly categorized according to their molecular weight as follows:
 (i) Conjugated polymers have molecular weights exceeding 10,000 atomic mass units (amu) and may be deposited from a solution using spin coating or printing techniques.
 (ii) Conjugated small molecules, including oligomers, have molecular weights less than a few 1000 amu and are normally deposited by vacuum evaporation. Small molecule organic semiconductors are generally described as molecular semiconductors. Molecular semiconductors deposited using vacuum evaporation cannot normally be processed from solution owing to their poor solubility in common organic solvents.

It is known to combine carbon nanotubes with polymeric semiconductors in order to produce a solution for use in making thin films. However, this process has several disadvantages. For example, carbon nanotubes do not normally form a stable dispersion in a solution of polymeric semiconductors. That is to say, the carbon nanotubes are not held in solution for extended periods but tend to settle out. Consequently the solution must be ultrasonically agitated immediately prior to thin film deposition in order to redisperse the carbon nanotubes. Ultrasonically agitating the composite immediately prior to processing into a film is incompatible with current printing technologies thereby raising production costs and rendering it impractical from a manufacturing perspective. The agitation process can also be damaging to the organic semiconductor. Only a limited number of specific polymer structures are known to stabilise carbon nanotubes in a solution and so the range of potential applications is limited. Furthermore, the solubilising functionality in semiconductor polymers often hinders the formation of a closely packed molecular arrangement, which reduces charge carrier mobility.

It is widely known that it is difficult to place molecular semiconductors, normally deposited by vacuum evaporation, into a solution due to their poor solubility. However, it has been shown that a solution can be produced containing molecular semiconductors by functionalising the molecular semiconductor with solubilising side groups. This solution can then be used to deposit an organic semiconductor film for use in organic solar cells. However, the performance of such devices is reported to be very poor.

It is also known to use a small amount of soluble molecular semiconductor adsorbed onto the outer surface of carbon nanotubes. These experiments are directed towards studies of the interaction of specific conjugated aromatic compounds with the outer surface of carbon nanotubes and towards enhancing the solubility of carbon nanotubes using this method. Usually, the compound is treated and dried out prior to carrying out certain experiments on the resultant dry compound. However, neither the solution nor the resultant dry compound of functionalised carbon nanotubes is suitable for the manufacturing process involved in making thin film organic electronic devices.

It is also known to functionalise the internal cavities of carbon nanotubes by filling the cavity with organic semiconductor material or certain metals. Filling the inner cavity is not known to render carbon nanotubes soluble in common solvents. Filling the inner cavity is a means of modifying the optical and/or electronic properties of the carbon nanotubes. These experiments have been carried out for the purposes of fundamental scientific studies. Without further processing, the resultant compounds are not suitable for the manufacturing process involved in making electronic devices.

Further, it is also known to manufacture devices using thin film organic semiconductor layers, such as organic solar cells (photovoltaic devices). If organic solar cells are to be a commercially viable means of harvesting energy from sunlight, they must be efficient, durable and low cost.

Organic solar cells using polymeric semiconductors can be manufactured using low cost solution processing techniques such as ink jet printing, spin coating, doctor blading or screen printing. However, most polymeric semiconductors have an optical band gap of 2-3 eV. For solar cell applications this limits the device efficiency because a large part of the solar spectrum is not harvested. The band gap in molecular semiconductors (1.4-3.2 eV) is more conducive with utilising the solar spectrum. However, this normally requires a vacuum deposition method, which, when fabricating solar cells, is much more costly than their polymeric analogue. Whereas, polymeric semiconductors are typically more susceptible to physical and chemical degradation than molecular semiconductors. If organic solar cells are to achieve their potential as a clean low cost energy solution the power efficiency and durability of these devices must be improved whilst retaining the cost advantages of solution processing.

Most organic semiconductors have low charge carrier mobility, which is a limiting factor in determining the efficiency of devices utilising this class of semiconductor. The ease with which charge is transferred between molecules is determined by the degree of overlap between the frontier orbitals, Highest Occupied Molecular Orbital (HOMO) and Lowest Occupied Molecular Orbital (LUMO), of adjacent molecules and is therefore a function of the molecular arrangement within the solid. The charge carrier mobility in molecular solids is therefore highest in highly ordered solids. However, cost effective methods of fabricating devices (e.g. printing and spin coating) are not normally conducive with the formation of a crystalline lattice. Organic semiconductors prepared using printing and spin coating techniques most closely resemble an amorphous state. Consequently, charge carrier mobility is low ($10^{-6}$ $cm^2$ $V^{-1}$ $s^{-1}$ to $10^{-3}$ $cm^2$ $V^{-1}$ $s^{-1}$), and is the primary contribution to device series resistance.

A further consequence of weak intermolecular interactions is the limited exciton diffusion length in organic semiconductors, which limits the thickness of the absorbing layers in organic solar cells, thereby limiting the optical density and power conversion efficiency. The exciton diffusion length in polymeric semiconductors is typically significantly lower than those in molecular semiconductors.

In recent research by Wang et al. (Materials Science and Engineering 2005 pp. 296-301), the fabrication of a carbon nanotube and molecular semiconductor composite was discussed. This research aims to improve the interface between the carbon nanotube and dye molecules in order to facilitate photo-induced charge transfer. Also, it is suggested that the molecular semiconductor is made soluble by functionalising with alkyl chains. However, the films produced are only of one micron thickness, i.e. 'cast coated'. Also, neither the molecular order within the semi-conducting matrix, nor the electronic structure is addressed resulting in a film not suitable for use in electronic devices.

Further, engineering solutions to many of the problems associated with protecting organic devices from the detrimental effects of ambient water and oxygen are now established. However, poor thermal management in these devices remains a serious problem, particularly for solar cell applications, which must withstand extremes of temperature over extended periods. Electrical (Joule heating) and optically generated heat anneals the organic layers causing them to inter-diffuse and undergo morphological changes including loss of interfacial adhesion. Whilst annealing to induce controlled morphological change at the fabrication stage can enhance the performance of some devices (e.g. bilayer heterojunction solar cells), heat is ultimately detrimental to device lifetime. To keep Joule heating to a minimum the device series resistance must be minimized. Optical heating is particularly problematic in solar cell devices where the infrared photons are not efficiently harvested.

The present invention aims to overcome, or at least alleviate, some or all of the afore-mentioned problems.

In one aspect the present invention provides a method of producing a thin film comprising uniformly dispersed carbon nanotubes, the method comprising the steps of: adapting a molecular semiconductor to make it soluble; adapting the molecular semiconductor to facilitate the formation of a high degree of molecular order and frontier orbital overlap between adjacent molecules; adapting carbon nanotubes to make them soluble; combining the soluble carbon nanotubes and the soluble molecular semiconductor in a solvent to form a solution; producing the thin film from the solution.

In one aspect of this invention, a carbon nanotube composite is prepared into a thin film using only soluble derivatives of molecular semiconductors, of the type normally deposited using vacuum deposition techniques. To make these materials soluble in common organic solvents, the conjugated core is functionalized at the periphery, or non-peripheral positions, with solubilising moieties. Unlike most semiconducting polymers these types of organic semiconductor can exhibit a high degree of molecular order (i.e. a semi-crystalline state) when processed from solution onto amorphous substrates such as, for example, glass. By careful selection of the position and nature of the solubilising functionality it is possible to select the molecular configuration with maximum overlap between frontier molecular orbitals on adjacent molecules, thereby maximizing the charge carrier mobility and exciton diffusion length. Functionalisation is also a versatile means of tuning the electronic structure of the molecular semiconductor for a specific application. Carbon nanotubes can be stabilized in solution via non-covalent interactions with the soluble molecular semiconductor, a suitable solvent or direct chemical functionalisation using solubilising moieties. The method of carbon nanotube stabilisation in solution is not limited to any particular method.

This invention represents a significant advance in organic semiconductor technology, enabling better device performance through improved stability and device efficiency. More specifically this invention increases the prospects for the commercial exploitation of organic solar cells; the solar cells offering high efficiency, good operational stability and large area deposition capability.

Composites of carbon nanotube and molecular semiconductors have enormous potential as functional materials within organic electronic devices when processed into thin films. These materials offer:
  i. improved thermal management in organic electronic devices, owing to the high thermal conductivity of CNTs, extending device lifetime.
  ii. enhanced device efficiencies due to efficient charge carrier injection/extraction.
  iii. enhanced device efficiencies due to reduced device series resistance.
  iv. enhanced trapping of light in solar cells, owing to the propensity of carbon nanotubes to scatter light.
  v. versatility due to the ability to tune the electronic and optical properties of both the molecular semiconductor and carbon nanotube, maximizing potential applications.
  vi. compatibility with flexible low cost substrates and existing low cost, large area solution processing technologies.

Further advantages of using molecular semiconductors as described in this patent application arise as follows:
  (a) Suitably functionalised molecular semiconductors can be processed to form thin films with a high degree of molecular order. Molecular order is desirable since it maximises charge carrier mobility and exciton diffusion length, thereby enhancing device efficiency and ultimately device lifetime.
  (b) Molecular semiconductors are typically more chemically and thermally stable than semiconductor polymers, extending device lifetime.
  (c) Readily available molecular semiconductors have a greater range of band gaps, which can be tuned using appropriate functionality.

Specific embodiments of the present invention will now be described by way of example only, with reference to the accompanying drawings, in which.

Figure 1A:
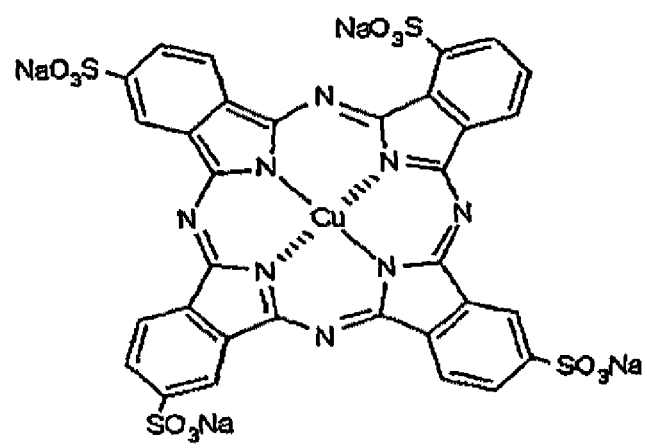
FIG. 1A shows a functionalised metal (copper) phthalocyanine compound.
Figure 6:
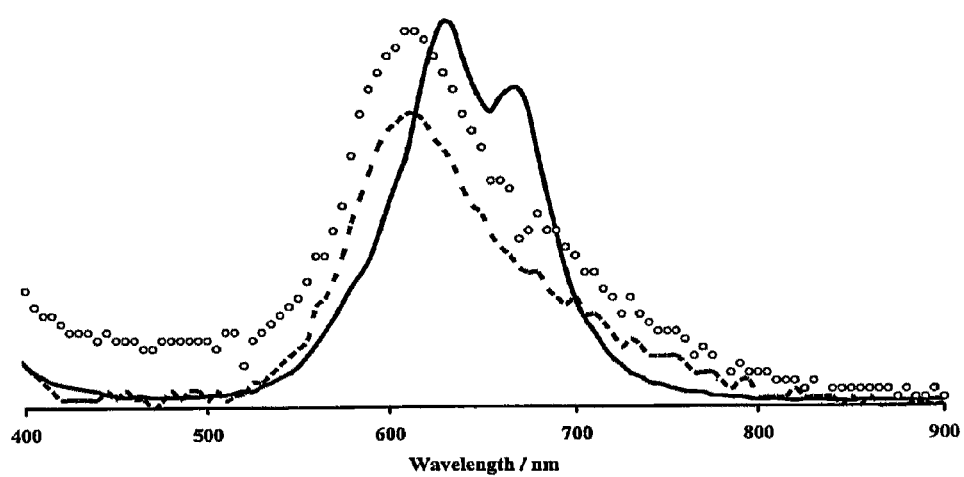

FIG. 6 shows the Q-band absorption of the compound shown in FIG. 1A from: (i) a dilute aqueous solution (solid line); (ii) a thin film spin cast from a concentrated aqueous solution (dashed line); (iii) a thin film spin cast from a concentrated aqueous solution of the compound shown in FIG. 1A combined with chopped acid functionalised carbon nanotubes shown in FIG. 3 (carbon nanotube weight percentage 11.8%) (open circles).

Figure 7A:
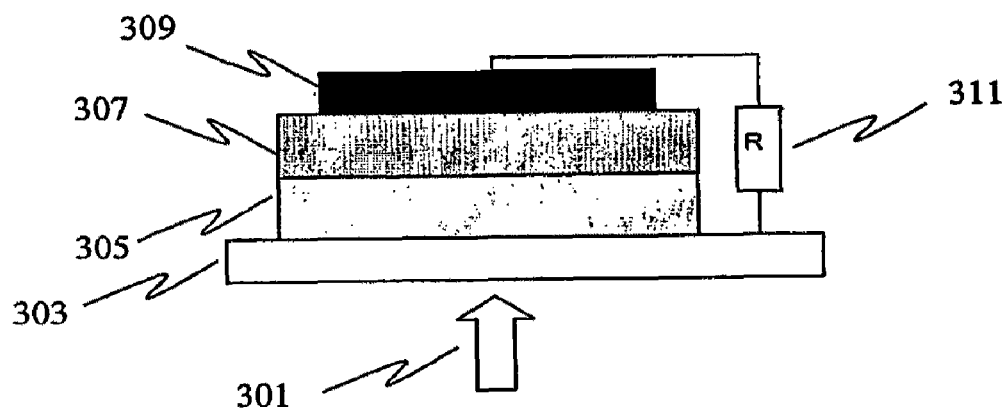
Figure 7B:
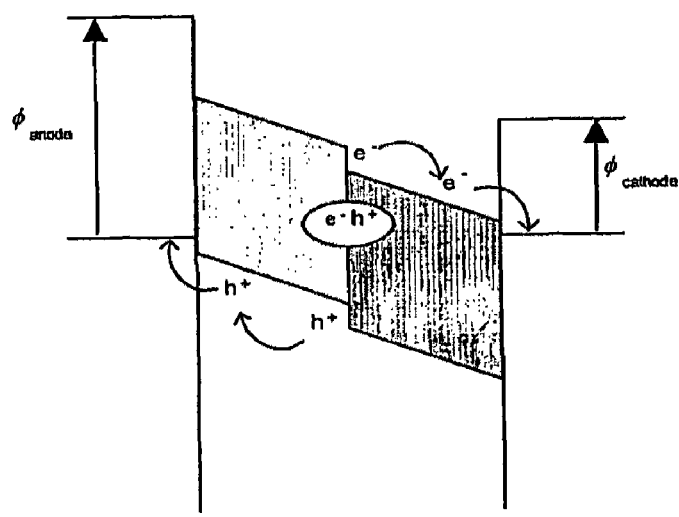
Figure 8:
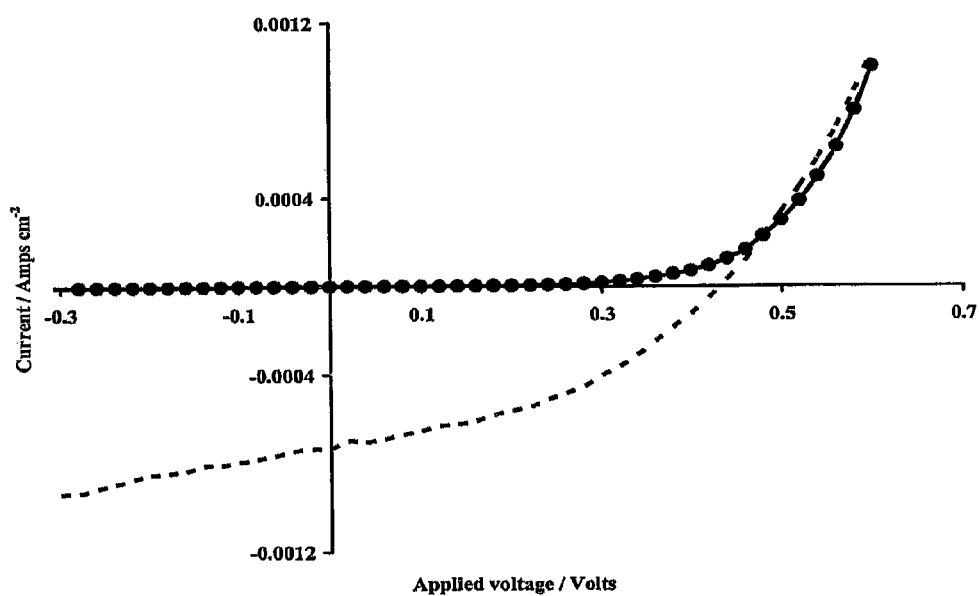

FIG. 7A shows a schematic diagram of a bilayer organic solar cell;

FIG. 7B shows a band diagram of a bilayer organic solar cell;

FIG. 8 shows a graph illustrating the current density as a function of applied bias with and without simulated solar illumination of a bilayer organic solar cell utilising a composite of acid functionalised carbon nanotubes (FIG. 3) and the molecular semiconductor in FIG. 1A as the donor layer.

Figure 9A:
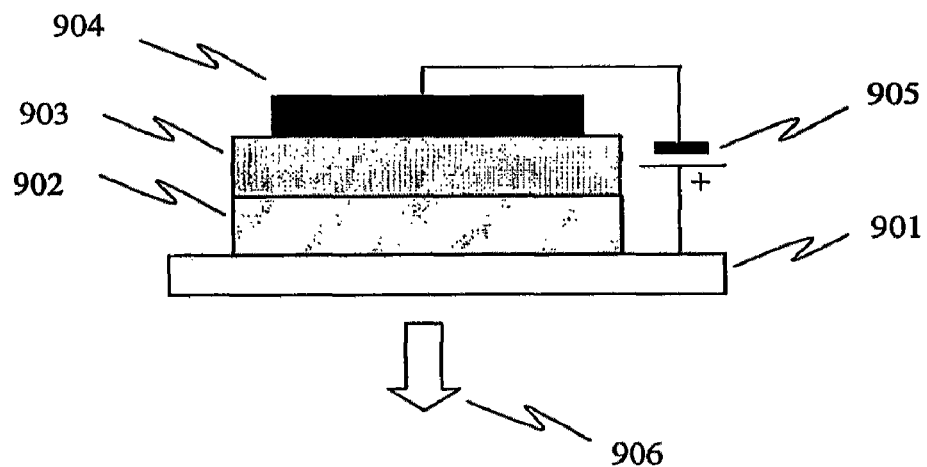
Figure 9B:
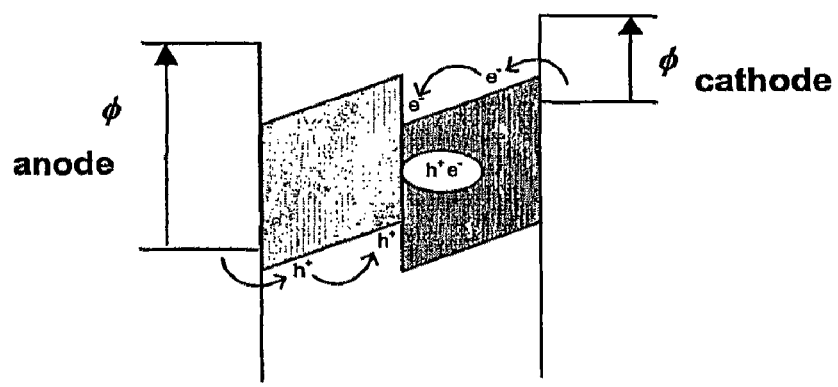
Figure 10:
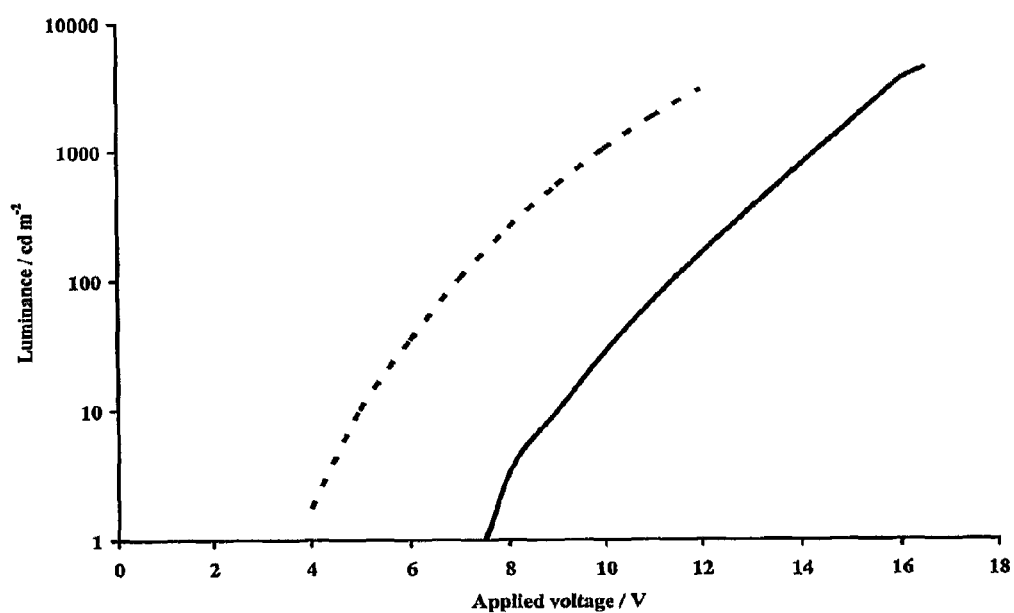

FIG. 9A shows a schematic diagram of a bilayer organic light-emitting diode;

FIG. 9B shows a band diagram of a bilayer organic light-emitting diode;

FIG. 10 shows a graph of a bi-layer organic light emitting diode's luminance characteristics, with and without a composite layer of acid functionalised carbon nanotubes (FIG. 3) and the molecular semiconductor shown in FIG. 1A incorporated into the device.

FIRST EMBODIMENT

There are several stages required in order to produce a thin film device incorporating a composite of carbon nanotubes and molecular semiconductor material: (i) preparation of a stable composite solution of carbon nanotubes and molecular semiconductor; (ii) processing the composite solution to form a thin film wherein the carbon nanotubes are uniformly distributed; (iii) fabrication of an electronic device utilising the carbon nanotube-molecular semiconductor thin film.

The first stage is to grow carbon nanotube material using any known carbon nanotube growth method. As discussed above, carbon nanotubes may be synthesised by several different methods including chemical vapour deposition (CVD), arc discharge and laser ablation methods. In this embodiment, the carbon nanotubes are grown using a high temperature CVD method, as is well known in the art.

The resultant carbon nanotubes are bundled together, and so need to be released from this state. In order to produce a stable concentrated dispersion of carbon nanotubes, in this embodiment, the carbon nanotubes are oxidized by acid treatment, or the like, to create polar groups on the outer surface of the carbon nanotube including carboxylic acid moieties. This process is called acid functionalisation and renders the carbon nanotubes soluble in water. That is, the carbon nanotubes are adapted, or functionalised so that they become soluble.

The preparation of stable carbon nanotube dispersions is key to the fabrication of nanocomposite thin films as described below. It is preferable that solubilising moieties have at least one of the following:

(i) an electronic functionality;

(ii) a low surface density, so as not to isolate the carbon nanotubes from the semiconductor matrix; or (iii) suitable dimensions so as not to significantly impede the flow of charge carriers between the carbon nanotubes and the semiconductor matrix (i.e. <1 nm in length).

In this embodiment multi-walled carbon nanotubes with a typical diameter of 10 nm are placed into a concentrated mixture of sulphuric acid and nitric acid in the ratio 3:1. The mixture is then heated to a constant temperature of 50° C. and agitated using ultra-sonic waves for a period of 6 hours. This treatment introduces polar oxygen containing functionality onto the outer surface of the carbon nanotubes, rendering them water soluble and increasing the carbon nanotube work function. The carbon nanotubes are also chopped into shorter lengths by this procedure.

In order to separate the carbon nanotubes from the concentrated acid, the solution is diluted with deionised water. The very low pH of the solution causes the acid functionalised carbon nanotubes to settle over a period of 24 hours, whereupon 90% of the acid is decanted off. The remaining solution plus carbon nanotubes is further diluted using deionised water, filtered using a 0.1 nm polycarbonate (or PTFE) filter and washed with deionised water until the washings are pH neutral. The filter paper coated in carbon nanotubes is then submerged in a small amount of deionised water whereupon the carbon nanotubes spontaneously disperse into solution. The resulting stable dispersion of carbon nanotubes in water is centrifuged to remove any residual particulate contamination from the solution.

FIG. 1A shows a diagram of the functionalised metal phthalocyanine compound utilised in this embodiment. The tetrasulfonic acid tetrasodium salt functionality renders the phthalocyanine core soluble in water.

Figure 1B:
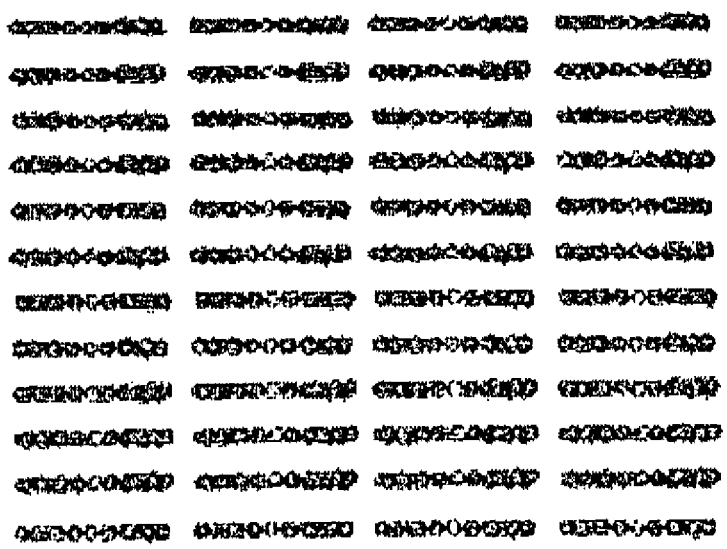
FIG. 1B shows the molecular configuration (co-facial) in a film of the compound shown in FIG. 1A when spin cast from an aqueous solution.

FIG. 1B shows a diagram of the typical molecular configuration in a spin cast film of the compound shown in FIG. 1A, as discussed below.

The molecular semiconductor used in this embodiment is a member of a large family of compounds based around the phthalocyanine (Pc) macrocycle. Pc can be metal free, or have a metal ion held in the central cavity of the macrocycle as used in this embodiment. By peripheral, or non-peripheral, functionalisation they can be made soluble in common solvents. The number, type and position of the solubilising groups has a profound effect on the degree of molecular order and configuration when the compound is processed into a thin film as shown in FIG. 1B. The molecules form columnar stacks. The crystalline order is localised and does not normally extend over macroscopic areas. The degree of order in the solid state strongly influences its optoelectronic properties (e.g. charge carrier mobility and exciton diffusion length). In addition to affecting the solubility and film forming properties of these compounds, derivatisation is also an effective means of tuning the electronic structure and optical absorption characteristics of the molecular semiconductor. Phthalocyanines have a planar structure and it is the π-π interactions between the macrocycles that is the driving force for aggregation. Not all forms of functionalised Pc give the desired molecular configuration when spin cast and so the choice of functionality must be made with care.

In this embodiment the copper phthalocyanine molecular semiconductor is functionalised at the periphery with tetra-sulfonic acid tetrasodium salt functionality to: (i) make the molecular semiconductor water soluble; (ii) increase the molecular ionisation potential (tune the electronic structure); (iii) promote a columnar molecular arrangement when the compound is cast into a thin solid film for device applications, as discussed below.

The molecular semiconductor is then dissolved in a suitable solvent, which, in this embodiment, is water. The molecular semiconductor solutions are often used at a concentration close to saturation (>10 mg ml$^{-1}$) and so it is necessary to filter, preferably using a 0.1 micron filter, prior to blending the semiconductor solution with carbon nanotubes.

The next step involves combining the carbon nanotubes with the molecular semiconductor. That is, the carbon nanotubes are placed in a suitable solvent, which, in this embodiment is water. The carbon nanotube mixture is then added to the solvent mixture that contains the molecular semiconductor. This carbon nanotube-molecular semiconductor blend forms a stable dispersion.

The solution of molecular semiconductor and carbon nanotubes in a solvent is then used to make a thin film. In this embodiment, spin coating technology is utilised. Spin-coating technology is a simple rapid film forming process, making it attractive for industrial-scale manufacture of devices. Typically a drop of the composite solution is dropped onto a spinning substrate. Upon contact the drop spreads uniformly across the substrate. The film thickness is a function of the volume of the droplet, the solution concentration, substrate spin speed and the solvent used. The resulting film is typically less than 100 nm in thickness and comprises carbon nanotubes uniformly distributed throughout the molecular semiconductor matrix, where the semiconducting matrix has a high degree of molecular order.

In this embodiment the thin film is baked at 150° C. in dry air for 30 minutes immediately after processing into a thin film to remove residual water.

Figure 3:
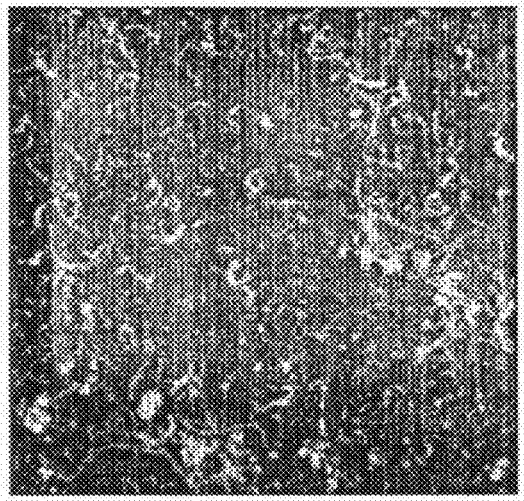
FIG. 3 shows an atomic force microscope (AFM) image of chopped multi-walled, acid functionalised carbon nanotubes drop cast from an aqueous solution onto a mica substrate.
Figure 4:
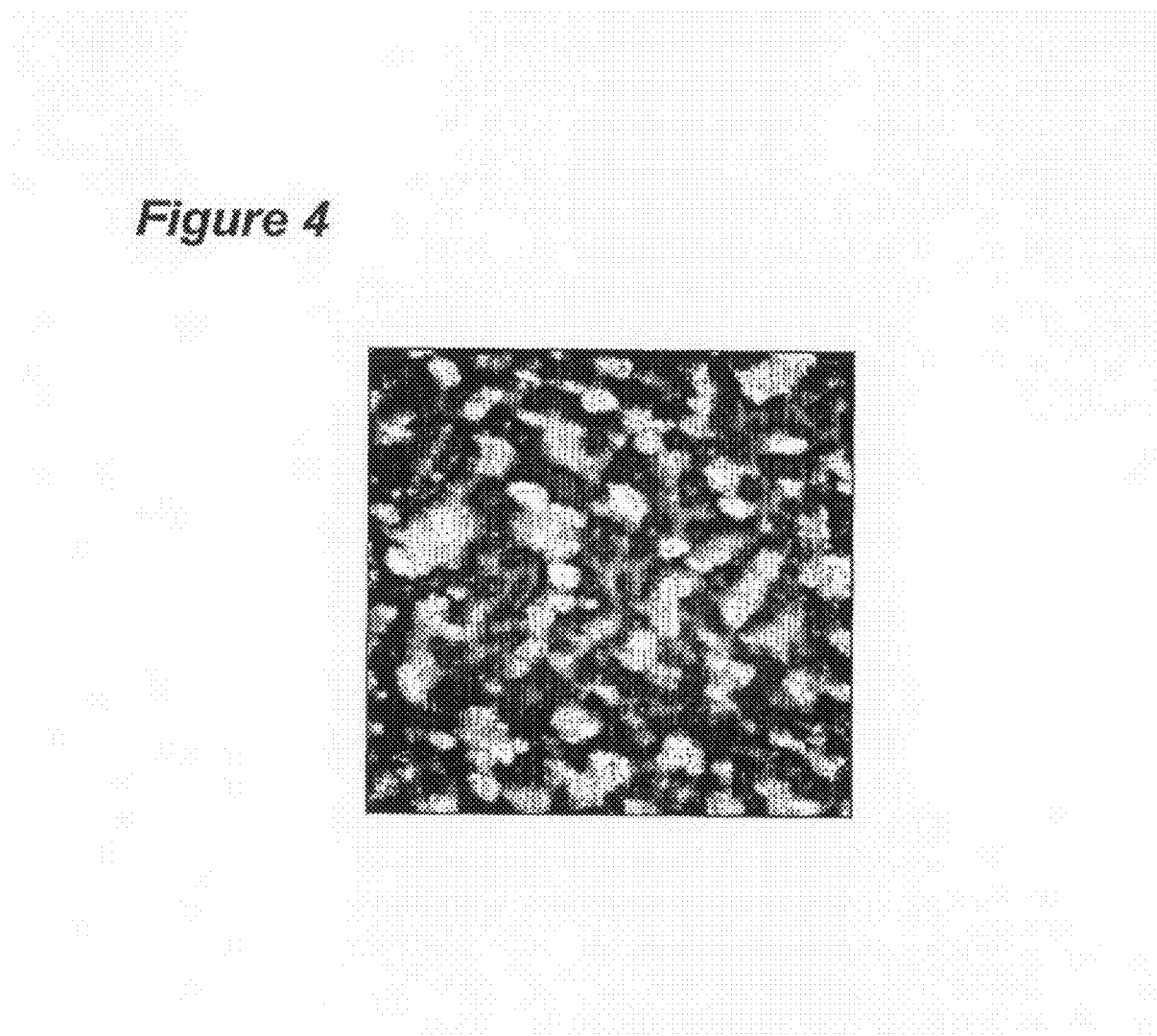
FIG. 4 shows an AFM image of a spin cast thin film using a composite of the acid functionalised carbon nanotubes shown in FIG. 3 and the water soluble copper phthalocyanine shown in FIG. 1A, wherein the thin film has been partially decomposed to reveal the carbon nanotubes.

FIG. 4 shows a 3×3 μm AFM topographic image of a spin cast film on glass of the composite of the acid functionalised carbon nanotubes shown in FIG. 3 and the water soluble copper phthalocyanine shown in FIG. 1A. After the deposition of the film, the film was heated at 400° C. in air for an extended period to partially decompose the organic matrix, revealing the embedded carbon nanotubes. Exposed carbon nanotubes can be seen all across the image. The height scale is 15 nm.

Figure 5:
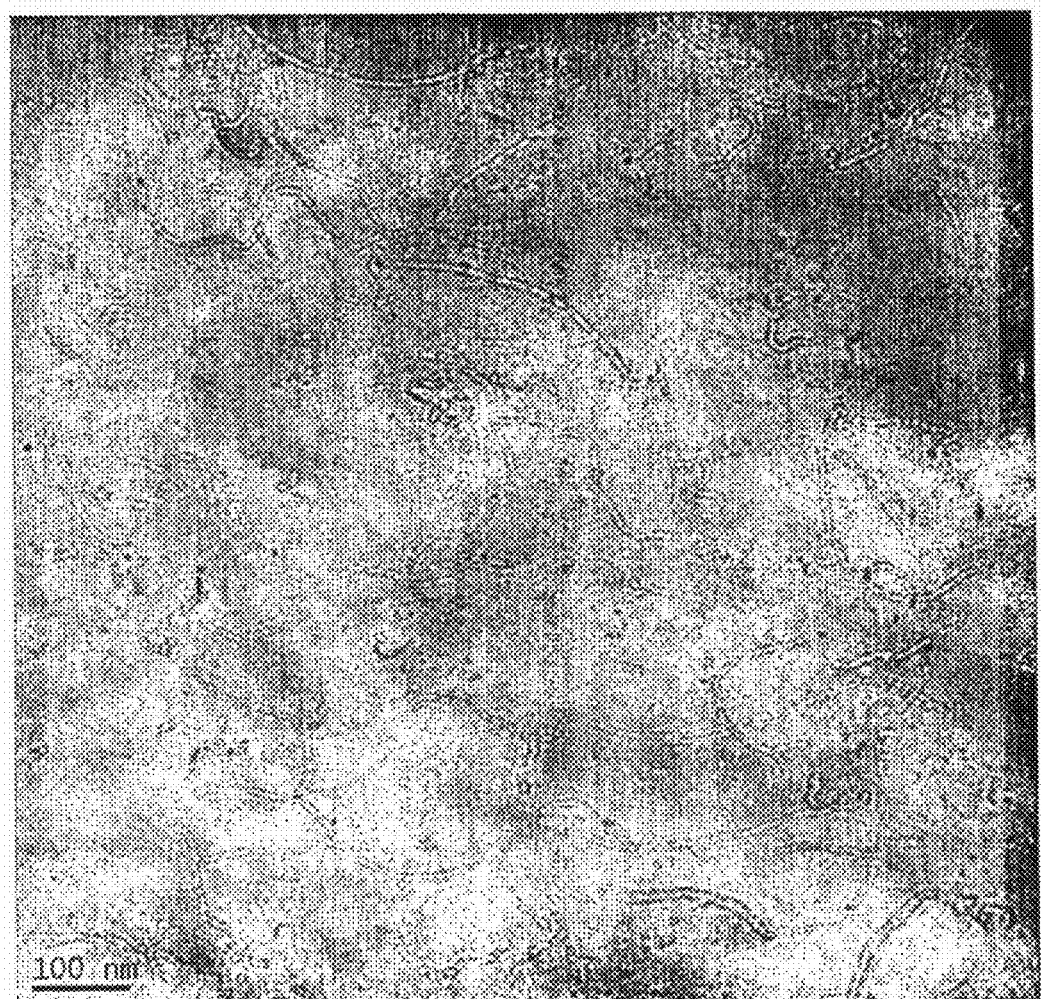
FIG. 5 shows a 1×1 μm transmission electron microscope (TEM) image of a drop cast film of a composite of the acid functionalised carbon nanotubes shown in FIG. 3 (weight percentage 3.4%) and the water soluble copper phthalocyanine shown in FIG. 1A.

FIG. 5 shows a 1×1 μm transmission electron microscope image of a drop cast film on a nickel TEM grid of the composite of the acid functionalised carbon nanotubes shown in FIG. 3 and the water soluble copper phthalocyanine shown in FIG. 1A. The composite was cast onto a nickel TEM grid. The thickness of the composite film in the image is less than 100 nm. The carbon nanotubes are clearly visible uniformly distributed within the phthalocyanine matrix.

FIG. 6 shows the Q-band absorption of the compound shown in FIG. 1A from: (i) a dilute aqueous solution (solid line); (ii) a thin film spin cast from a concentrated aqueous solution (dashed line); (iii) a thin film spin cast from a concentrated aqueous solution of the compound shown in FIG. 1A combined with chopped acid functionalised carbon nanotubes shown in FIG. 3 (carbon nanotube weight percentage 11.8%) (open circles)

The Q-band in the spectra of both thin films is broadened and blue shifted with respect that, in solution, indicative of a cofacial molecular arrangement within the films. The Q-band in both thin film spectra have the same shape and peak position indicating that the carbon nanotubes do not appreciably disrupt the degree of molecular order. The Q-band in the dilute aqueous solution has contributions from both monomer absorption (~665 nm) and aggregate absorption (~625).

FIG. 6 shows that the carbon nanotubes do not appreciably disrupt the degree of molecular order since the position and shape of the Q-band in the absorption spectra of thin films with and without carbon nanotubes are comparable. In FIG. 5 the weight percentage of carbon nanotubes in the composite is 11.8%. However the weight percentage of carbon nanotubes to molecular semiconductor may vary according to the application, and may or may not be above the percolation threshold. The percolation threshold for multi-walled carbon nanotubes uniformly distributed in a polymers matrix is reported to be as low as 0.06%.

It is important to select a molecular semiconductor suitable for this application. In order to do so, two tests can be carried out as follows. Ensure the molecular semiconductor has a high degree of molecular order when processed into a thin film. Ensure the solubilising functionality of the molecular semiconductor, at least, does not hinder the formation of a columnar (tilted or untilted) molecular arrangement when processed into a thin film. Further, a test can be carried out to ensure that the introduction of carbon nanotubes with the molecular semiconductor to form a composite material does not disrupt the molecular arrangement within the molecular semiconductor phase.

1. A first test shows that soluble molecular semiconductors that form thin films have a high degree of molecular order when processed from solution into a thin film on a substrate.

To test this condition, one of test a) or b) below could be used. If the result of one is ambiguous, then the second test could be used to determine if the molecular semiconductor is suitable.

a) X-diffraction of a supported film of the molecular semiconductor:

Films with a 'high degree of molecular order' have one or more strong peaks in the diffraction pattern. Strong peaks are defined as peaks in the X-ray diffraction pattern being sufficiently prominent that they are clearly discernable from featureless characteristic of the supporting substrate and background noise.

Amorphous materials are characterized by a broad, featureless X-ray diffraction pattern.

b) Ultraviolet-visible spectroscopy (UV-vis).

HOMO-LUMO (i.e. frontier orbitals) transitions in molecular semiconductors can normally be probed using ultra-violet or visible light. HOMO-LUMO transitions are very sensitive to the proximity of neighboring molecules and are therefore a good indicator of crystalline order.

The UV-vis spectrum of a very dilute solution of molecular semiconductor corresponds to that of an amorphous state.

The UV-vis spectrum of a supported film of the molecular semiconductor exhibiting a 'high degree of molecular order' should differ from that of the amorphous state, where a difference in the spectrum is defined as a discernable change in the shape and/or position of absorption peaks assigned to HOMO-LUMO electronic transitions, indicative of a known molecular arrangement.

2. In a second test, it is shown that the solubilising functionality of the molecular semiconductor promotes, or, at least, does not hinder the formation of a columnar (tilted or untilted) molecular arrangement when processed from solution into a thin film. A columnar molecular arrangement is defined here as face-to-face stacking of the aromatic cores with at least 50% area overlap between adjacent conjugated cores.

For planar aromatic molecular semiconductors, such as those described in this application, a high intermolecular overlap is only realized for a face-to-face arrangement of the aromatic molecular cores of neighboring molecules. Consequently columnar (tilted or untilted) are the most favorable molecular configurations.

To test this condition, one of tests, a), b), or c) could be used.

a) Ultraviolet-visible spectroscopy (UV-vis).

The UV-vis spectrum of a very dilute solution of molecular semiconductor corresponds to that of an amorphous state.

HOMO-LUMO (i.e. frontier orbitals) transitions in molecular semiconductors can normally be probed using ultra-violet or visible light. HOMO-LUMO transitions are very sensitive to the proximity of neighboring molecules and are therefore a good indicator of molecular architecture. By comparing the UV-vis absorption spectra of a thin film of molecular semiconductor (supported on a transparent substrate) to that of the amorphous state, the molecular configuration in the film can often be ascertained.

b) X-ray diffraction is widely used to determine molecular configuration within a crystalline solid.

c) Microscopy: scanning tunneling microscopy STM or the like, can be used to image the molecular configuration.

3. In a third test it is determined that, in the composite material, the carbon nanotubes do not disrupt the molecular arrangement within the molecular semiconductor phase.

In this test it is shown that addition of carbon nanotubes does not disrupt the 'high degree of molecular order' within the molecular semiconductor phase of the composite.

a) Ultraviolet-visible spectroscopy (UV-vis) is used.

For low carbon nanotube concentration, e.g. weight percentage <15%, the peak position and shape of the bands corresponding to HOMO-LUMO transitions in the molecular semiconductor component of the composite film should not differ from those in the film spectrum of the pure semiconductor.

New peaks assigned to interactions between the carbon nanotube and molecular semiconductor may appear. All peaks will be superimposed onto a background absorption associated with carbon nanotubes. For carbon nanotube weight percentages >15%, peaks associated with carbon nanotube-molecular semiconductor may begin to dominate the spectrum complicating the interpretation.

The present invention may be utilised in any type of electronic device. In this embodiment the electronic device is an organic solar cell (OSC), however the invention is not limited to these devices.

Organic solar cells are made up of one or more semiconductor organic films that are sandwiched between two electrodes.

FIG. 7A shows a schematic diagram of a bilayer OSC device according to this embodiment. The device comprises a transparent anode 303, made of Indium-tin Oxide (ITO) coated glass with a sheet resistance of <100 Ohms per square. The ITO coating on the glass substrate is typically 100-300 nm thick. Next to the transparent anode 303 are two organic layers, a donor layer 305 formed from the nanocomposite material, and an acceptor layer 307. Next to the acceptor layer 307 is a cathode 309. The load 310 is also indicated in the diagram. Light 301 enters the device through the transparent anode 303 and is absorbed by the organic layers (305, 307).

FIG. 7B shows a band diagram corresponding to the OSC device shown in FIG. 7A. When the light is absorbed by the organic layers (305,307) tightly bound electron-hole pairs (excitons) are created in both the donor and acceptor layer. At the organic interface, excitons are split and the free charges transported to the electrodes, whereupon they are extracted to the external circuit via the cathode.

The nanocomposite material forms the donor layer in the device structure shown in FIG. 7A. In this case the semiconductor heterojunction is completed by vacuum deposition of the acceptor layer and top electrode. The acceptor layer comprises a 50 nm layer of Buckminsterfullerene ($C_{60}$). The cathode comprises a 50 nm layer of aluminium. The OSC described above employs a nanocomposite donor layer comprising 7.4% weight carbon nanotubes. The nanocomposite film is spin cast from an aqueous solution containing 12.5 mg ml$^{-1}$ of the compound shown in FIG. 1A and 1 mg ml$^{-1}$ acid functionalised carbon nanotubes (FIG. 3), and is approximately 15 μm thick. It will be understood that the nanocomposite film could be of any other appropriate thickness, for example from 10-200 nm.

Carbon nanotubes have a high electrical conductivity and so when dispersed in an organic semiconductor the conductivity of the resulting composite can be enhanced. If the carbon nanotube concentration exceeds the percolation threshold, the dispersed carbon nanotubes form a continuous conductive network embedded within the semiconductor matrix. Under these circumstances the composite is no longer a semiconductor. However, an interpenetrating network of carbon nanotubes has important benefits for OSCs, as follows: (i) The carbon nanotube-network functions as a nanometric heat sink, channelling heat generated electrically or optically during device operation away from the heat sensitive semiconductor matrix, thus extending device lifetime; (ii) A high area network electrode facilitates efficient charge carrier extraction in solar cells, thus enhancing the power conversion efficiency and lifetime of these devices; (iii) Carbon nanotubes scatter light increasing the likelihood of absorption by the organic semiconducting layers.

FIG. 8 shows a graph indicating the current density as a function of applied bias with and without simulated solar illumination (AM1.5D, 100 mW cm$^{-2}$ (1 sun)), of a bilayer organic solar cell utilising a composite of acid functionalised carbon nanotubes (FIG. 3) and the molecular semiconductor in FIG. 1A as the donor layer. The power conversion efficiency of solar cells is proportional to the fill factor. The fill factor of the device, whose characteristics are shown in FIG. 8, is relatively large for such a simplistic cell structure. With the addition of an exciton blocking layer and optimisation of the layer thicknesses and carbon nanotube loading, significant improvements in power conversion efficiency can be expected. Furthermore the fabrication process is environmentally friendly and safe because it does not require the use of organic solvents.

SECOND EMBODIMENT

The invention may also be utilised in an organic light emitting diode (OLED), as described in this embodiment.

OLEDs are made up of one or more semiconductor organic films that are sandwiched between two electrodes.

FIG. 9A shows a schematic diagram of a model bilayer OLED device according to this embodiment. The device comprises a transparent anode 901. Next to the transparent anode 901 are two organic layers, a hole transport layer 902 and an emitter layer 903. Next to the emitter layer is a cathode 904. The external power supply is also illustrated on the diagram 905. Light (906) is produced in the emitter layer 903 and exits the device through the hole transport layer 902 and anode 901.

FIG. 9B shows a band diagram corresponding to the OLED device shown in FIG. 9A. When a forward bias is applied across the electrodes via an external power supply (905), holes are injected from the anode (901) into the hole transport layer (902) and electrons are injected from the cathode into the emitter layer (903). Electrons and holes recombine to form excitons in the emitter layer (903) close to the interface with the hole transport layer (902). Excitons formed in the emitter layer can decay with the emission of light (906). Light exits the device through the hole transport layer and anode (901).

The model bilayer OLED employed in this embodiment comprises an ITO glass anode/50 nm TPD/50 nm Alq$_3$/50 nm Al, where TPD is N,N'-bis(3-methylphenyl)-N,N'-diphenyl-1,1'-biphenyl-4,4'-diamine, Alq$_3$ is tris(quinolin-8-olato)aluminium and Al is aluminium. The TPD, Alq$_3$ and Al layers are vacuum deposited.

A spin cast thin film of the nanocomposite described in the first embodiment is incorporated into the vacuum deposited OLED illustrated in FIG. 9A between the ITO glass anode and the TPD hole transport layer. The spin cast film is of an approximate thickness of 25 nm. However, the film could be of any appropriate thickness, for example, from 10-100 nm. The nanocomposite layer comprising 11.8% weight percent carbon nanotubes spin cast from an aqueous solutions containing 7.5 mg ml$^{-1}$ of the compound shown in FIG. 1A and 0.5 mg ml$^{-1}$ acid functionalised carbon nanotubes (FIG. 3). At this interface the nanocomposite functions as a hole injecting layer, facilitating efficient positive charge carrier injection into the device. The high work function and aspect ratio of the carbon nanotubes facilitates efficient hole injection into the HOMO of the functionalised copper phthalocyanine matrix.

FIG. 10 is a graph showing the luminance difference between a light-emitting diode with and without a layer of the nanocomposite described in the first embodiment between the ITO anode and TPD hole-transport layer. The graph shows that incorporation of this functional thin film into the device structure significantly enhances device performance as compared to the same device without the composite layer. The composite layer is indicated by the dotted line, and the solid line indicates a reference device without a composite layer. The graph shows the increased luminance achieved when the composite layer is utilised when compared to the same device structure without the composite layer for the same applied voltage. FIG. 10 is evidence that the nanocomposite layer enhanced charge carrier injection into the OLED.

FURTHER EMBODIMENTS

It will be understood that embodiments of the present invention are described herein by way of example only, and that various changes and modifications may be made without departing from the scope of the invention.

Further, it will be understood that synthesis of stable dispersions of carbon nanotubes can be carried out using any suitable method, such as the following methods for example. The carbon nanotubes may be covalently functionalised on their outer surface using amide or ester linkages to couple to the carbon nanotube surface. Further, the carbon nanotubes may be non-covalently functionalised by introducing them into an aromatic amine solvent, such as aniline, or functionalising with specific molecular semiconductors including fullerenes.

It will be understood that the carbon nanotubes may be further functionalised by adapting their interior structure. For example, by inserting different metals, organic semiconductor materials (including either polymer or molecular semiconductors) or a mixture of both into the internal cavity of the carbon nanotube. The insertion of such a material changes the electronic properties of the carbon nanotube and so allows the carbon nanotube to be electronically tuned for its specific purpose.

It will be understood that the solution processed nanocomposites described herein can be used in conjunction with organic polymers or vacuum deposited molecular semiconductors, or a combination of them both, in order to fabricate a complete device.

It will further be understood that other devices may be formed using the solution processed nanocomposites described, wherein a thin film is required exhibiting the properties as herein described. For example, liquid crystal display may include a backlight with OLEDs including a thin film, as described above, incorporated therein.

It will also be understood that the solution processed nanocomposites described herein can be processed into a thin film suitable for application in organic electronic devices using any suitable process, for example: (i) spin coating; (ii) ink jet printing; (iii) screen printing; (iv) doctor blading.

It will also be understood that the molecular semiconductor may be any suitable type of conjugated molecular semiconductor, or indeed may be a mixture of two or more different conjugated molecular semiconductors. For example, the molecular semiconductor could be a mixture of copper phthalocyanine and metal free phthalocyanine.

Figure 2A:
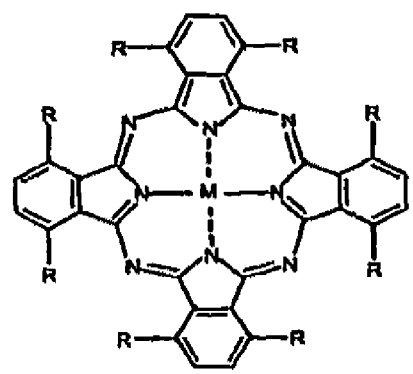
FIG. 2A shows a functionalised metal-free phthalocyanine molecule.
Figure 2B:
FIG. 2B shows the molecular configuration (herringbone) in a film of the molecule shown in FIG. 2A when spin cast from a chloroform solution.

Other examples of molecular semiconductors that can potentially form highly ordered thin films when functionalised to make them soluble, include porphyrin, perylene, acene and oligothiophene derivatives. All of these materials can be purchased commercially or synthesised as required. For example, the molecular semiconductor may be a metal free phthalocyanine, as shown in FIG. 2A, where M=(H$^+$)$_2$ and R=(CH$_2$)$_7$CH$_3$. The alkyl functionality renders the phthalocyanine core soluble in chloroform. This produces a film with a herringbone molecular configuration as shown in FIG. 2B when spin cast from a chloroform solution. The molecules form tilted columnar stacks. The crystalline order is localised and does not normally extend over macroscopic areas.

Further, the invention may be utilised in a system on a chip (SoC) device. For example, but not limited to, a carbon nanotube gas sensor integrated with an OSC, OLED, battery, microprocessor and drive electronics on a common platform. This SoC would function as a fully integrated gas sensor powered by a battery charged using an OSC. Information regarding gas detection would be relayed to a remote device for processing utilising an infra-red OLED.

It will be understood that, in the OSC device, the nanocomposite material may replace the acceptor layer instead of, or as well as the donor layer. The semiconductor and carbon nanotube type and functionality chosen will depend upon which layer is being replaced.

It will be understood that, in the OLED device, the nanocomposite material may function as an electron injecting layer if incorporated between the cathode and the emitter layer. The semiconductor and carbon nanotube type and functionality chosen will depend on whether the nanocomposite functions as an electron injecting layer or hole injecting layer.

Other examples of devices in which a thin film as described above could be utilised are as follows: any type of photo detector or sensor, gas detector or sensor, transistors or field emitting display.

The invention claimed is:

1. A method of producing a thin film comprising uniformly dispersed carbon nanotubes, the method comprising the steps of:
   adapting a molecular semiconductor to make it soluble;
   adapting the molecular semiconductor to facilitate formation in the thin film of a columnar molecular arrangement comprising face to face stacking of aromatic molecular cores of adjacent molecules with at least 50% area overlap between the cores;
   adapting carbon nanotubes to make them soluble;
   combining the soluble carbon nanotubes and the soluble molecular semiconductor in a solvent to form a solution;
   producing the thin film from the solution.

2. The method of claim 1, further comprising the step of mixing the carbon nanotubes with a solvent prior to combining with the molecular semiconductor.

3. The method of claim 2, wherein the solvent is an aromatic amine.

4. The method of claim 3, wherein the aromatic amine is aniline.

5. The method of claim 1, further comprising the step of mixing the molecular semiconductor with a solvent prior to combining with the carbon nanotubes.

6. The method of claim 5, further comprising the step of mixing the carbon nanotubes in a solvent to produce a carbon nanotube solution, and adding the carbon nanotube solution to the molecular semiconductor solution.

7. The method of claim 5, wherein the solvent is an aromatic amine.

8. The method of claim 7, wherein the aromatic amine is aniline.

9. The method of claim 1, wherein the carbon nanotubes are adapted using amide or ester linkages.

10. The method of claim 1, wherein at least one of the molecular semiconductor adapting steps is carried out by modifying the conjugated core at the periphery of the semiconductor molecule with moieties.

11. The method of claim 1, wherein at least one of the molecular semiconductor adapting steps is carried out by modifying the conjugated core at a non-periphery position of the semiconductor molecule with moieties.

12. The method of claim 1 comprising the further step of adapting the carbon nanotubes on the outer surface to tune their electrical or optical properties.

13. The method of claim 1 comprising the further step of adapting the carbon nanotubes on the inner surface to tune their electrical or optical properties.

14. The method of claim 13 wherein the adaptation of the inner surface comprises the step of filling the inner cavity with a metal.

15. The method of claim 14 wherein the adaptation of the inner surface comprises the step of filling the inner cavity with a molecular semiconductor.

16. The method of claim 1 comprising the further step of adapting the molecular semiconductor to tune the electrical or optical properties.

17. The method of claim 1, wherein the molecular semiconductor is a metal free phthalocyanine.

18. The method of claim 1, wherein the molecular semiconductor is metal free porphyrin.

19. A method of manufacturing an electronic device, wherein the method comprises the step of producing a thin film layer using the method according to claim 1.

20. The method of claim 19, wherein the electronic device is a solar cell.

21. The method of claim 19, wherein the electronic device is a light emitting diode.

22. The method of claim 19, wherein the electronic device is a backlight adapted for use in a liquid crystal display.

23. The method of claim 19, wherein the electronic device is a system on a chip device.

* * * * *